United States Patent [19]
Kitaoka et al.

[11] Patent Number: 5,301,059
[45] Date of Patent: Apr. 5, 1994

[54] SHORT-WAVELENGTH LIGHT GENERATING APPARATUS

[75] Inventors: Yasuo Kitaoka; Kazuhisa Yamamoto; Kiminori Mizuuchi, all of Osaka; Makoto Kato, Nishinomiya; Fumihiro Sogawa, Tokyo, all of Japan

[73] Assignee: Matsushita Electric Industrial Co., Ltd., Osaka, Japan

[21] Appl. No.: 20,335

[22] Filed: Feb. 19, 1993

[30] Foreign Application Priority Data

Mar. 3, 1992 [JP] Japan .................................. 4-045319
Jul. 9, 1992 [JP] Japan .................................. 4-182030

[51] Int. Cl.$^5$ .............................................. G02F 1/35
[52] U.S. Cl. ..................... 359/332; 359/328; 372/22; 385/122
[58] Field of Search ............... 385/122; 359/326–332; 372/21, 22, 75

[56] References Cited

U.S. PATENT DOCUMENTS

| | | | |
|---|---|---|---|
| 4,907,237 | 3/1990 | Dahmani et al. | 372/75 X |
| 5,128,948 | 7/1992 | Papuchon et al. | 372/21 |
| 5,185,752 | 2/1993 | Welch et al. | 372/22 |
| 5,233,620 | 8/1993 | Shinozaki et al. | 372/22 |

FOREIGN PATENT DOCUMENTS

| | | |
|---|---|---|
| 0473441 | 3/1992 | European Pat. Off. . |
| 0485187 | 5/1992 | European Pat. Off. . |
| 2-209784 | 8/1990 | Japan . |

OTHER PUBLICATIONS

"Milliwatt-order blue-light generation in a periodically domain-inverted LiTaO$_3$ waveguide" by K. Yamamoto et al; Optics Letters, vol. 16, No. 15; Aug. 1, 1991; pp. 1156–1158.

"Wide Range Frequency Tunable DSM Laser Diode" by H. Asakura et al; Electronic Information Communications Society; 1987; p. 4-61 (w/English translation).

IEE Proceedings J. Optoelectronics vol. 138, No. 5, Oct. 1991, Stevenage, GB, pp. 337–342, K. O. Nyairo et al. 'Multichannel grating cavity (MGC) laser transmitter for wavelength division multiplexing applications'.

Electronics Letters, vol. 27, No. 12, Jun. 6, 1991, Enage, GB, pp. 1053–1054, N. Onodera et al. 'Frequency having in harmonically-driven mode-locked semiconductor lasers'.

Primary Examiner—John D. Lee
Attorney, Agent, or Firm—Lowe, Price, LeBlanc & Becker

[57] ABSTRACT

A short-wavelength light generating apparatus comprising a pumping semiconductor laser and an intra-cavity solid state laser, the intra-cavity solid state laser is excited in response to a laser light beam from the semiconductor laser to generate a short-wavelength light beam to an external. Also included in the apparatus is an external grating mirror having on its one surface a reflection type diffraction grating and placed between the semiconductor laser and the intra-cavity solid state laser. The external grating mirror reflects the laser light beam from the semiconductor laser to feedback a portion of the laser light beam to said semiconductor laser so that an oscillated wavelength of the semiconductor laser becomes within a wavelength acceptance of the intra-cavity solid state laser. Further, the external grating mirror supplies a portion of the laser light beam from the semiconductor laser to the intra-cavity solid state laser. This arrangement can output a stable harmonic wave with a high efficiency.

10 Claims, 11 Drawing Sheets

PLAN VIEW OF
DIFFRACTION GRATING 104

PLAN VIEW OF
DIFFRACTION GRATING 104

PLAN VIEW OF 203

PLAN VIEW OF 104

PLAN VIEW OF 503

PLAN VIEW OF 606

PLAN VIEW OF 606

PLAN VIEW OF 606A

PLAN VIEW OF 804

PLAN VIEW OF 605

PLAN VIEW OF 911

PLAN VIEW OF 921

SHORT-WAVELENGTH LIGHT GENERATING APPARATUS

BACKGROUND OF THE INVENTION

The present invention relates to short-wavelength light generating apparatus using an external-cavity semiconductor laser (laser diode), which apparatus is applicable to a high-density optical disk system and others.

Recently, in optical disk high-density recording and image processing fields, there is a need to provide a green or blue light source by high-efficiency wavelength conversion using a semiconductor laser being used as an exciting (pumping) light source. The output light from the green or blue light source is required to be arranged to have the Gaussian transverse mode and to be converged up to near the diffraction limit and further required to be about several mW and stable in frequency and time. For obtaining such a high-power short-wavelength light generating apparatus using a semiconductor laser, a quasi-phase matching (QPM) type waveguide ("Optics Letters" Vol. 16, No. 15, 1156 (1991), written by Yamamoto and others) is used as a wavelength conversion means, or an intra-cavity (resonator) method is used which offers harmonic light with a semiconductor laser light being as the pumping light and a wavelength conversion device being provided within a resonator of a solid state laser.

FIG. 18 shows a schematic arrangement of a conventional short-wavelength light generating apparatus using a semiconductor laser and QPM polarization-inverted waveguide. In FIG. 18, light emitted from a semiconductor laser I01 is incident on a collimating lens I02 to be converted into a parallel light beam. The parallel light beam from the collimating lens I02 arrives at a half-wave ($\lambda/2$) plate I03 so that its deflection direction rotates, and then reaches a focusing lens I04, whose numerical aperture (NA) is 0.6, so as to be focused on an incident end surface I05 of a polarization-inverted waveguide I06, thereby obtaining blue light. Here, although anti-reflection coating is made on the end surface I05 of the waveguide I06 in order to prevent the return light to the semiconductor laser I01, in practice the return light of about 1% occurs.

FIG. 19 illustrates a schematic arrangement of an intra-cavity type short-wavelength light generating apparatus using a semiconductor laser pumped solid state laser. In FIG. 19, light emitted from a semiconductor laser Jo1 is incident on a collimating lens J02 to be converted into a parallel light beam and then incident on a focusing lens J03 to be focused on a laser material (Nd:YVO$_4$) J04. An incident end surface J05 of the laser material J04 is coating-processed so as to allow antireflection (AR) with respect to the wavelength (809 nm) of the light from the semiconductor laser J01 and allow high reflection (HR) with respect to an oscillated wavelength (1.064 $\mu$m) and harmonic light wavelength (532 nm). Further, the other surface J06 of the laser material J04 is antireflection-coated with respect to the oscillated wavelength and harmonic light wavelength. Light from the laser material J04 passes through a nonlinear optical material (crystal) KTP (KTiOPO$_4$) J08 to reach an output mirror J07. The output mirror J07 is high-reflection-coated with respect to the oscillated wavelength. The output mirror J07 and the end surface J05 of the laser material J04 constitutes a resonator whose basic wavelength is 1.064 $\mu$m so that the harmonic wave wavelength-converted by the nonlinear optical material KTP J08 can be obtained by the output mirror J07.

However, although the FIG. 18 apparatus can provide 1.1 mW blue light in relation to an incident light intensity 25 mW into the QPM polarization inverted waveguide, since the wavelength acceptance of the QPM polarization-inverted waveguide device is only 0.2 nm, the fluctuation of the oscillation frequency is 0.2 nm/°C. in relation to the fluctuation of the temperature of the semiconductor laser and the mode hopping due to the return light appears to be about 1 nm, the output is stable only for several seconds. Thus, the FIG. 18 apparatus is required to be arranged to make stable the wavelength of the semiconductor laser.

Further, in the FIG. 19 apparatus, in the case that a single longitudinal mode semiconductor laser is used as a pumping laser, the return light occurring because the transmission factor of the anti-reflection coating on the end surface (Nd:YVO$_4$) J05 of the laser material is about 93% causes the mode hopping and multiple longitudinal modes to occur, thereby generating noises because the half width of the absorption spectrum is several nm in the case of Nd:YVO$_4$. Thus, the FIG. 19 apparatus is also required to be arranged to make stable the wavelength of the semiconductor laser.

In the above-described FIGS. 18 and 19 apparatus, as one countermeasure for the return light, it is considered to use an isolator or improve the anti-reflection coating on the incident end surface. The isolator cannot prevent the wavelength fluctuation due to the fluctuation of temperature of the semiconductor laser itself concurrently with being costly and large in size. Further, difficulty is encountered to improve the anti-reflection coating in accordance with the current technique.

SUMMARY OF THE INVENTION

It is therefore an object of the present invention to provide a small-size short-wavelength light generating apparatus which is capable of generating a stable harmonic output with a high efficiency.

In accordance with the present invention, there is provided a short-wavelength light generating apparatus comprising: quasi-phase matching polarization-inverted waveguide means for converting a wavelength of an incident light beam; laser light generating means for generating a laser light beam; and external grating mirror means having a reflection type diffraction grating to reflect the laser light beam emitted from the laser light generating means and feedback a part of the laser light beam to the laser light generating means so that an oscillated wavelength of the laser light generating means becomes within a wavelength acceptance of the quasi-phase matching polarization-inverted waveguide means, and the external grating mirror means supplying a part of the laser light beam from the laser light generating means to the quasi-phase matching polarization-inverted waveguide means.

The external grating mirror means supplies the 0 order diffraction beam of the laser light beam from the laser light generating means to the quasi-phase matching polarization-inverted waveguide means, or the external grating mirror means feedbacks the second-order diffraction beam of the laser light beam from the laser light generating means to the laser light generating means, and the external grating mirror means supplies the first-order diffraction beam of the laser light beam from the laser light generating means to the quasi-phase matching polarization-inverted waveguide means.

Further, according to this invention, there is provided a short light generating apparatus comprising: resonator means including a laser oscillating material and an output mirror to take a resonant state with respect to an incident light beam; a nonlinear optical material provided between the laser oscillating material and the output mirror for converting a wavelength of a light beam resonating between the laser oscilating material and the output mirror; laser light generating means for generating a laser light beam; and external grating mirror means having a reflection type diffraction grating to reflect the laser light beam emitted from the laser light generating means to feedback a portion of the laser light beam to the laser light generating means so that an oscillated wavelength of the laser light generating means becomes within a wavelength acceptance of the laser oscillating material, and the external grating mirror means supplying a portion of the laser light beam from the laser light generating means to the laser oscillating material.

That is, one feature of this invention is to use a diffraction grating to make stable the wavelength of the laser light from a general semiconductor laser and increase the laser light intensity. In this invention, a portion (for example, 5%) of the laser light from the semiconductor laser is returned to the semiconductor laser and the remainder (for example, 95%) thereof is directed to the QPM, whereby the QPM can receive the laser light whose wavelength is stable and whose intensity is high. In the prior art the distance between the end surface of the laser and the difraction grating is used as a resonator length (since the end surface of the laser is antireflection-coated, the oscillation does not occur if the diffraction grating acting as an external resonator is not provided). In this invention, the length of the laser is used as the resonator length.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 20:
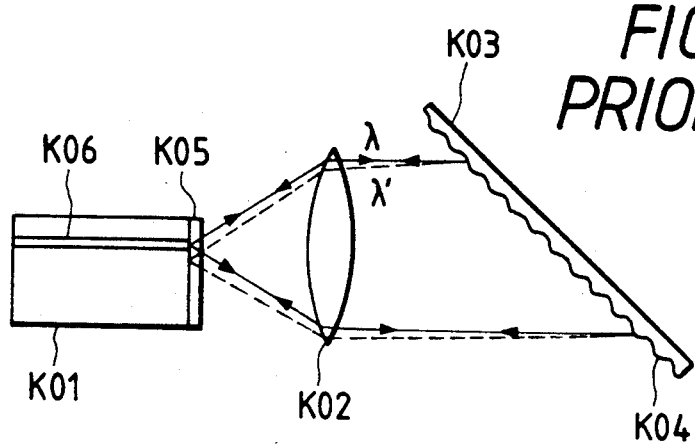
FIGS. 20 and 21 illustrate arrangement of conventional external-cavity semiconductor lasers.

Prior to describing embodiment of this invention, a brief description will be made in terms of an external-cavity semiconductor laser system which can stably generate a laser light beam. In the optical communication field, a semiconductor laser is required to stably generate light of a single wavelength and single longitudinal mode irrespective of fluctuation of the environmental temperature. For stable oscillation of a semiconductor laser, there is known an external-cavity (resonator) type semiconductor laser announced in "Electronic Information Communications Society" (1987). FIG. 20 shows a schematic arrangement of a conventional external-cavity semiconductor laser. In FIG. 20, K01 designates a 1.3 μm Fabry-Perot semiconductor laser, K02 represents a collimating lens whose numerical aperture is 0.6, K03 denotes an external grating mirror disposed to be inclined with respect to the optical axis, and K04 depicts a reflection type linear diffraction grating disposed on a portion of a surface of the external grating mirror K03. Light emitted from one end surface K05 of the semiconductor laser K01 passes through the collimating lens K02 to reach the diffraction grating K04. Then, due to the wavelength dispersion effect of the diffraction grating K04, only light having a specific wavelength λ returns toward the end surface K05 of the semiconductor laser K01 so as to be condensed on thereon to be optically feedbacked to an active layer K06 of the semiconductor laser K01. Light having different wavelengths λ' are diverged around the active layer K06. The specific wavelength λ depends upon the pitch of the diffraction grating K04 and the inclination angle of the external grating mirror K03. The end surface K05 of the semiconductor laser K01 is anti-reflection-coated. The diffraction grating K04 is constructed by forming an electron beam resist on an Si substrate and further by applying an electron beam. On the surface of the diffraction grating K04 there is formed an Au thin film which can provide high reflection.

Figure 21:
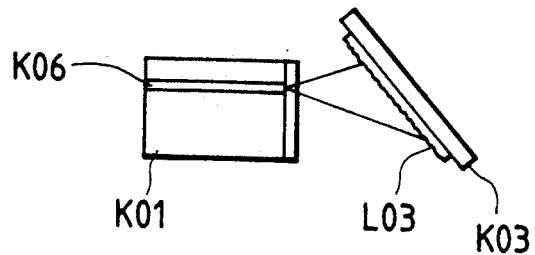

Further, FIG. 21 shows a schematic arrangement of another conventional external-cavity semiconductor laser system not having a collimating lens which is exemplified in the Japanese patent Publication No. 2-209784 In FIG. 21, the difference from the FIG. 20 arrangement is that the configuration of a diffraction grating L03 corresponding to the above-mentioned diffraction grating K04 in FIG. 20 is arranged as being a portion of a group of circles successively arranged. The omission of the collimating lens can shorten the resonator length and improve the modulation frequency. This arrangement can realize a single longitudinal mode oscillation with a wavelength of about 1.3 μm.

The present invention provides a short-wavelength light generating apparatus based on such an external-cavity semiconductor laser system.

Figure 1:
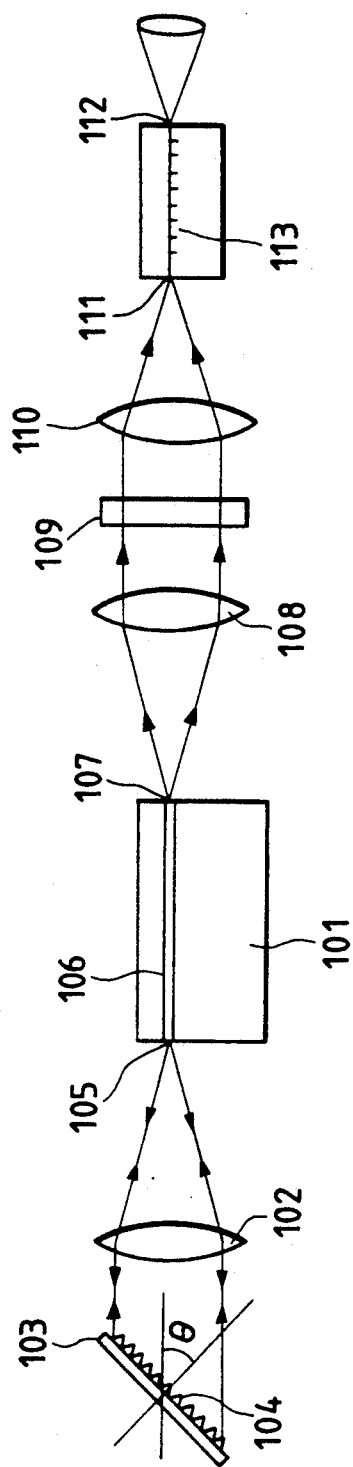
FIG. 1 shows an arrangement of a short-wavelength light generating apparatus according to a first embodiment of this invention.
Figure 1:
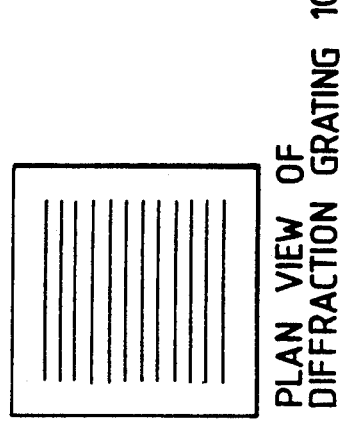

Referring now to FIG. 1, a description will be described hereinbelow in terms of a short-wavelength light generating apparatus according to a first embodiment of this invention. In FIG. 1, this short-wavelength light generating apparatus comprises an AlGaAs semiconductor laser which is 0.83 μm in wavelength and 50 mW in light intensity. At the left side of the semiconductor laser 101 in the illustration there is provided an external grating mirror 103 disposed to be inclined by an angle $\theta$ with respect to the optical axis of the semiconductor laser 101 having on its semiconductor laser 101 side surface a reflection type diffraction grating 104. Between the semiconductor laser 101 and the external grating mirror 103 there is disposed a collimating lens 102 whose numerical aperture N.A.=0.6. A laser light beam emitted from one end surface (the rear end surface) 105 of the semiconductor laser 101 is incident on the collimating lens 102 to be converted into a parallel light beam and then incident on the diffraction grating 104 on the external grating mirror 103. Due to the wavelength dispersion effect of the diffraction grating 104, only light having a specific wavelength is reflected to return along the same optical path, i.e., passing through the collimating lens 102 to be condensed on the end surface 105 of the semiconductor laser 101. That is, an optical feedback of the reflected light from the diffraction grating 104 (the external grating mirror 103) occurs toward an active layer of the semiconductor laser 101, thereby allowing the wavelength of the semiconductor laser 101 to become stable.

Here, the diffraction grating 104 has a linear diffraction grating whose pitch d is given by the following equation.

$$d = \lambda/(2 \sin\theta) \quad (1)$$

where $\lambda$ designates the oscillated wavelength of the semiconductor laser 101 and $\theta$ represents the inclination angle of the diffraction grating 104 with respect to the optical axis of the semiconductor laser 101. In this embodiment, since $\lambda = 0.83$ μm, d is set to be 0.83 μm when $\theta = 30°$.

Further, the end surface 105 of the semiconductor laser 101 is antireflection-coated so as to suppress an oscillation due to a resonator formed between the end surface 105 and the other end surface (a front end surface) 107 of the semiconductor laser 101. In this case, the feedback efficiency (efficacy) from the external grating mirror 103 becomes above 93%, whereby the laser light from the other end surface 107 becomes 40 mW in intensity.

On the other hand, at the right side of the semiconductor laser 101 in the illustration, there is provided a polarization-inverted waveguide 113 comprising a light waveguide and a polarization-inverted layer having a period of 3.7 μm. Between the semiconductor laser 101 and the polarization-inverted waveguide 113 there are disposed a collimating lens 108, a half-wave plate 109, and a focusing lens 110. The half-wave plate 109 is disposed between the collimating lens 108 and the focusing lens 110. A laser light beam having a wavelength of 830 nm, emitted from the surface 107 of the semiconductor laser 101, is incident on the collimating lens 108 to be converted into a parallel light beam and then incident on the half-wave plate 109 so that its deflection direction rotates. The light beam from the half-wave plate 109 is further incident on the focusing lens 110, having N.A.=0.6, to be condensed on one end surface 111 of the polarization-inverted waveguide 113. The light beam incident thereon propagates within the polarization-inverted waveguide 113 so as to be wavelength-converted to 415 nm whereby a harmonic wave light is emitted from the other end surface of the polarization-inverted waveguide 113 toward the outside.

Figure 2:
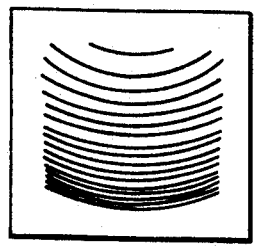
FIG. 2 shows a modification of the short-wavelength light generating apparatus according to the first embodiment of this invention.
Figure 2:
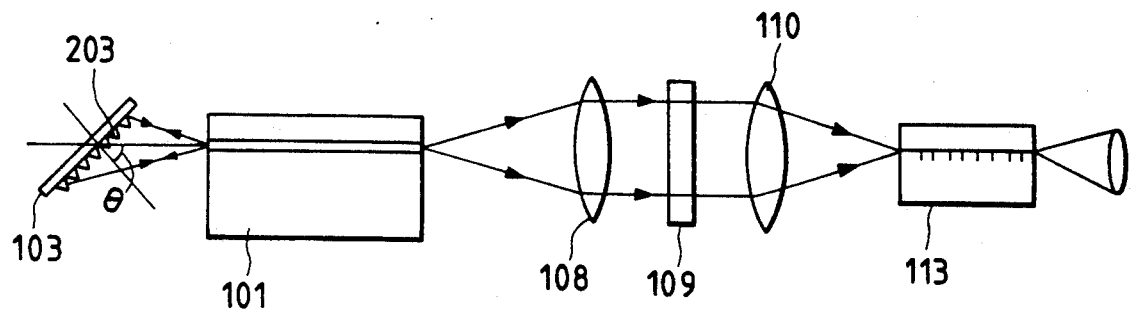

The above-described FIG. 1 short-wavelength light generating apparatus can be modified as illustrated in FIG. 2. In FIG. 2, the differences of the FIG. 2 short-wavelength light generating apparatus is that the collimating lens is omitted and a diffraction grating 203 is provided in place of the above-mentioned diffraction grating 104. This diffraction grating 203, as illustrated in FIG. 2, has a grating configuration which is formed as being a portion of a number of circles successively arranged. This is for directly feedbacking the light beam from the semiconductor laser 101. This arrangement can further reduce the dimension of the apparatus.

Figure 3:
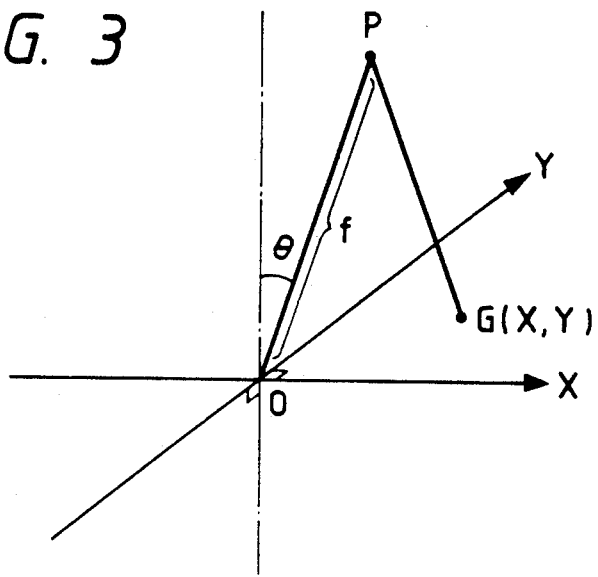
FIG. 3 is an illustration for describing a design principle of an external grating mirror to be used in this invention.

FIG. 3 is an illustration for describing the design principle of the external grating mirror 103. First, an assumptive orthogonal x-y coordinate plane is set on a flat base on which a diffraction grating is formed. Further, let it be assumed that an end surface (point) P of the active layer 106 of the semiconductor laser 101 (the end surface 105) from and on which the light is diverged and condensed exists on line inclined by $\theta$ in the y-axis direction with respect to the perpendicular from the origin of the aforementioned coordinate plane and further exists at a position separated by a distance f from the origin of the coordinate plane. Light emitted from the end surface P is incident on a point G on the diffraction grating and reflected therefrom to return to the P point. Here, if the diffraction grating is formed so that the phases of the light are coincident with each other, that arrangement can act as an external grating mirror. That is, $$2PG = m\lambda + (\text{constant}) \quad (2)$$

where PG designates the distance between the point P and the point G, $\lambda$ represents the wavelength of the semiconductor laser and m denotes an integer.

Here, if the constant is zero on the origin, the equation (2) can be expressed as follows.

$$x^2 + (y - f\sin\theta)^2 = (m\lambda/2 + f)^2 - (f\cos\theta)^2 \quad (3)$$

where x, y represent the orthogonal coordinate on the flat base on the diffraction grating is formed, f designates the distance between the end surface of the active layer 106 and the origin of the orthogonal coordinate, $\theta$ depicts the angle made between a line between the active layer end surface and the coordinate origin and the perpendicular of the flat base, and $\lambda$ indicates the oscillated wavelength of the semiconductor laser, and m is an integer.

When an external grating mirror is constructed under the conditions of $\lambda = 0.809$ μm, $f = 2$ mm and $\theta = 45°$, since one side of the area which can be drawn by electron beam is about 1 mm, the feedback efficiency is approximately 30% and the intensity of the laser light obtained is approximately 10 mW.

Figure 4:
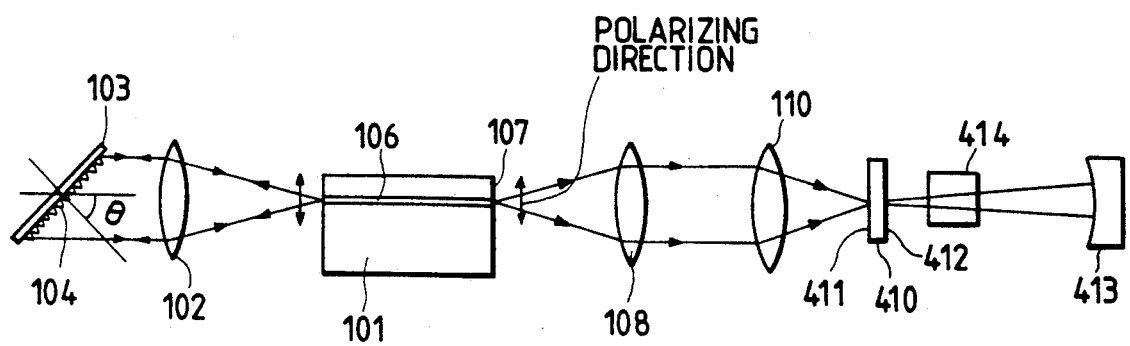
FIG. 4 illustrates an arrangement of a short-wavelength light generating apparatus according to a second embodiment of this invention.
Figure 4:
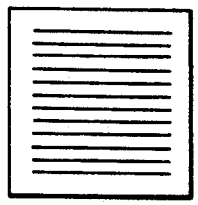

Further, a description will be described hereinbelow in terms of a second embodiment of this invention. FIG. 4 shows an arrangement of a short-wavelength light generating apparatus according to the second embodiment where parts corresponding to those in FIG. 1 are marked with the same numerals. In FIG. 4, the short-wavelength light generating apparatus according to this embodiment comprises an AlGaAs semiconductor laser 101 which is 809 nm in wavelength and 60 mW in intensity. At the rear side (the left side in the illustration), there are provided a collimating lens 102 having N.A. = 0.55 and an external grating mirror 103 inclined by an angle $\theta$ with respect to the optical axis of the semiconductor laser 101. On one surface of the external grating mirror 103 there is formed a reflection type linear diffraction grating 104 having a grating pitch d expressed by the above-mentioned equation (1). A laser light beam emitted from the semiconductor laser 101 reaches the diffraction grating 104 after passing through the collimating lens 102. Similarly, due to the wavelength dispersion effect, only the light having a specific wavelength is reflected from the diffraction grating 102 and condensed on a rear end surface 105, whereby the optical feedback to an active layer 106 of the semiconductor laser 101 occurs, thereby making stable of the wavelength of the light from the semiconductor laser 101.

In this embodiment, the diffraction grating 104 is designed with respect to the oscillated wavelength 809 nm of the semiconductor laser 101 such that d = 809 nm and $\theta = 30°$. Further, the rear end surface 105 is antireflection-coated so as to suppress the oscillation due to the rear end surface 105 and a front (outgoing) end surface 107 of the semiconductor laser 101. In this case, the feedback efficiency becomes above 90% and the intensity of light from the front end surface 107 becomes 45 mW.

On the other hand, at the front side (the right side in illustration) of the semiconductor laser 101 there are disposed a collimating lens 108, a focusing lens 110, a laser material (Nd:YVO$_4$) 410, a nonlinear optical material (KTP) 414 and an output mirror 413. The light beam, having a wavelength of 809 nm, emitted from the front end surface 107 of the semiconductor laser 101 is first incident on the collimating lens 108 to be converted into a parallel light beam and then incident on the focusing lens 110. In this embodiment, a half-wave plate (109 in FIG. 1) is not provided between the collimating lens 108 and the focusing lens 110. The focusing lens 110 has a focal length of f = 12.5 mm. The light beam from the focusing lens 110 is converged on one end surface 411 of the laser material 410. The end surface 411 is coating-processed so as to allow the anti-reflection with respect to the wavelength (809 nm) of the semiconductor laser 101 and further to permit the high reflection with respect to the oscillated wavelength (1.064 μm) and the harmonic wavelength (532 nm). On the other hand, the other end surface 412 of the laser material 410 is coating-process so as to allow the anti-reflection with respect to the wavelengths of 1.064 μm and 532 nm. The light from the laser material 410 arrives at the output mirror 413 after passing through the nonlinear optical material 414. The output mirror 413 is coating-processed to permit the high reflection with respect to the wavelength of 1.064 nm, and the output mirror 413, together with the one end surface 411 of the laser material 410, constitutes a resonator with respect to the basic wave of 1.064 μm, whereby the harmonic wave converted by the nonlinear optical material 414 can be obtained from the output mirror 413.

Figure 5:
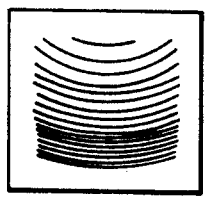
FIG. 5 shows a modification of the FIG. 4 short-wavelength light generating apparatus.
Figure 5:
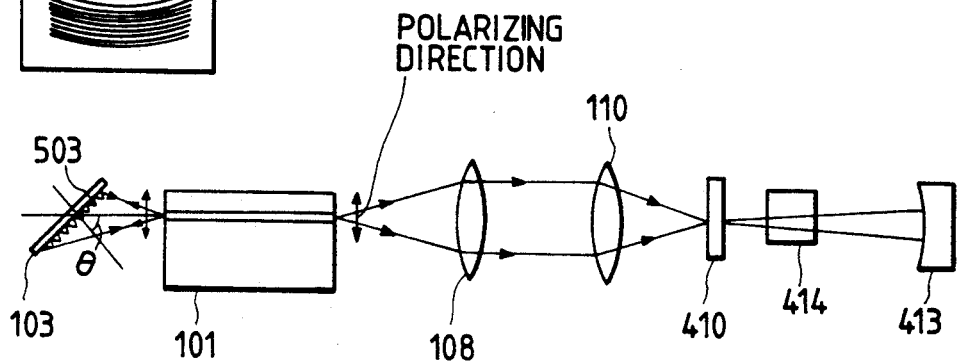

FIG. 5 shows a modification of the FIG. 4 short-wavelength light generating apparatus. In FIG. 5, parts corresponding to those in FIG. 4 are marked with the same numerals and the description will be omitted for brevity. The difference of the FIG. 5 short-wavelength light generating apparatus from the FIG. 4 short-wavelength light generating apparatus is that the collimating lens (102) is omitted and the diverged light from the semiconductor laser 101 is directly reflected from a diffraction grating 503 to be optically feedbacked to the semiconductor laser 101. In this case, the diffraction grating 503 differs in grating pattern from the diffraction grating in FIG. 4. That is, the diffraction grating 503 is arranged to be a portion of a group of circles successively arranged.

Figure 6:
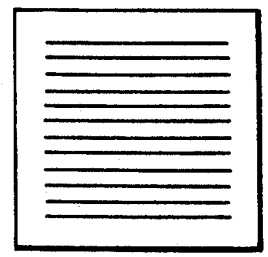
FIG. 6 shows an arrangement of a short-wavelength light generating apparatus according to a third embodiment of this invention.
Figure 6:
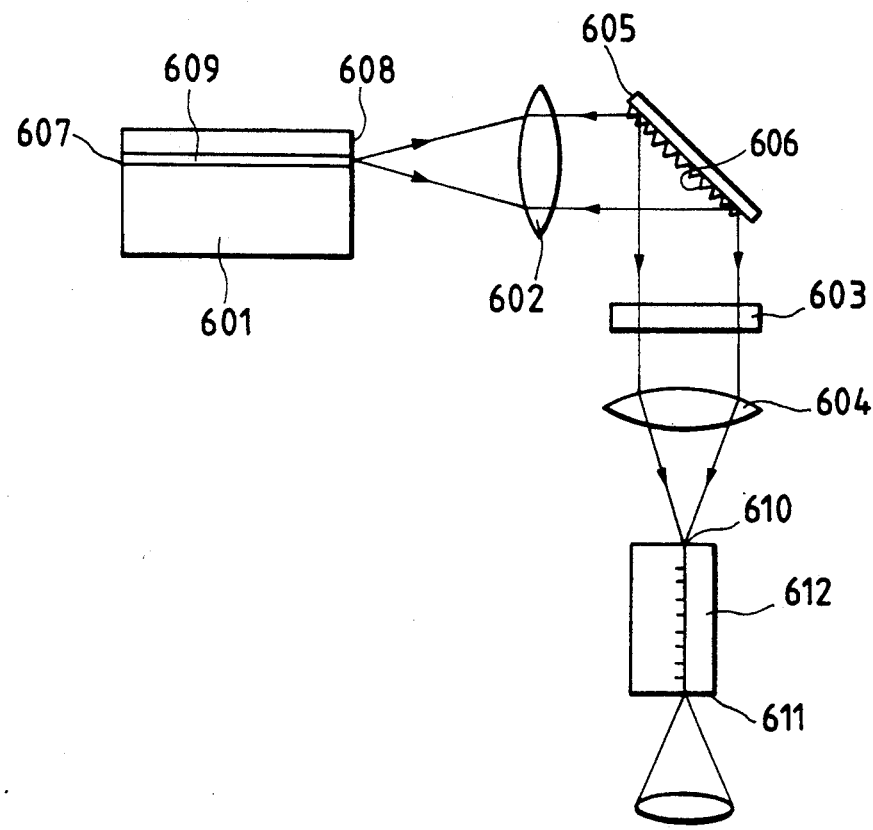

Moreover, a description will be made hereinbelow in terms of a third embodiment of this invention. FIG. 6 shows an arrangement of a short-wavelength light generating apparatus according to the third embodiment of this invention. In FIG. 6, this short-wavelength light generating apparatus comprises an AlGaAs semiconductor laser 601 which is 0.83 μm in wavelength and 50 mW in intensity. A high-reflection coating is made on a rear end surface 607 of the semiconductor laser 601 and a low reflection coating is made on an outgoing (front) end surface 608 thereof. In this embodiment, an external grating mirror is not provided at the left side of the semiconductor laser 601 but provided at the right side (output side) thereof. A laser light beam emitted from the semiconductor laser 601 is first incident on a collimating lens 602, whose N.A. = 0.55, and then incident on a reflection type diffraction grating 606 disposed on a surface of an external grating mirror 605. This external grating mirror 605 is inclined by an angle $\theta$ with respect to the optical axis of the semiconductor laser 601, and the diffraction grating 606 has a linear grating pattern whose pitch is given in accordance with the above-mentioned equation (1). In the case that the external grating mirror 605 is placed at the rear side of the semiconductor laser 601, difficulty can be encountered to align the optical axes because of the provision of the collimating lens, and the feedback efficiency is limited because of the limitation of the area which can be drawn by electron beam. However, in the case that it is placed at the output side of the semiconductor laser 601, if the feedback from the diffraction grating 606 to an active layer 609 of the semiconductor laser 601 is about 10%, it is possible to make the wavelength stable, and it is possible to take out all the other light as the reflected light. This means that it is possible to obtain the light of about 90% as the laser output. The light beam, having a wavelength of 830 nm, reflected from the diffraction grating 606 is directed to a half-wave plate 603 and then directed to a focusing lens 604 so as to be condensed on one end surface 610 of a polarization-inverted waveguide 612 comprising a polarization-inverted layer whose period is 3.7 μm. Then, the light propagates within the polarization-inverted waveguide 612 and is outputted from the other end surface 611 after being changed to have a wavelength of 415 nm.

Figure 8:
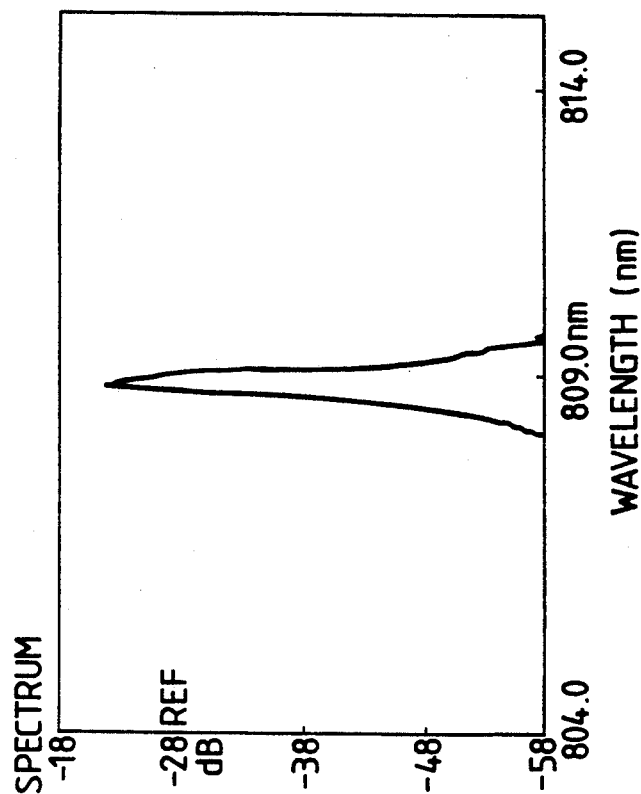
FIG. 8 shows a longitudinal mode spectrum of a semiconductor laser when its wavelength is locked.
Figure 7:
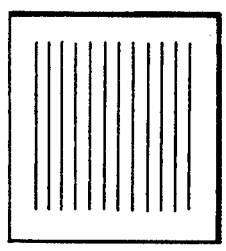
FIG. 7 shows an arrangement of a short-wavelength light generating apparatus according to a fourth embodiment of this invention.
Figure 7:
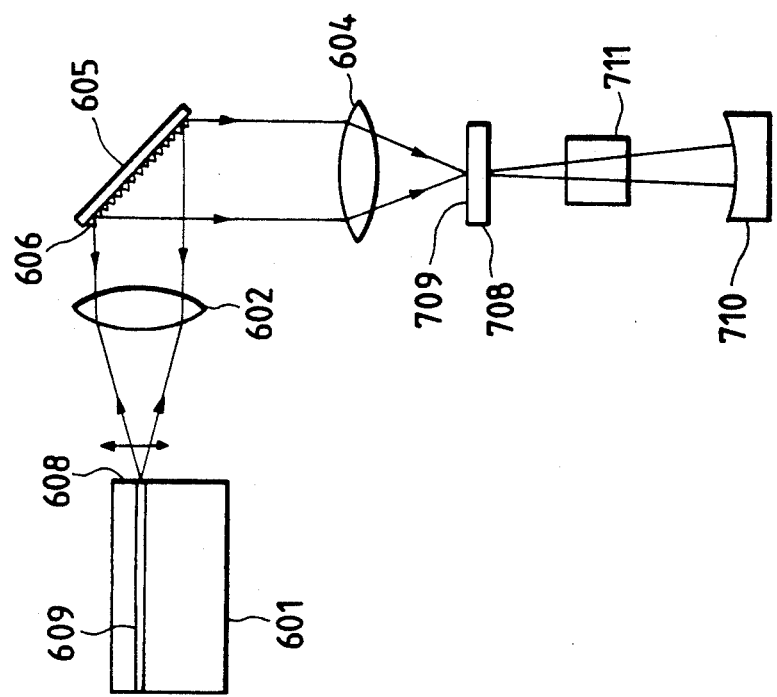

FIG. 7 shows a short-wavelength light generating apparatus according to a fourth embodiment of this invention where parts corresponding to those in FIG. 6 are marked with the same numerals. This embodiment relates to a short-wavelength light generating apparatus using an intra-cavity solid state laser. In FIG. 7, designated at numeral 601 is a semiconductor laser arranged to be 809 nm in wavelength and 60 mW in intensity. At the output side of the semiconductor laser 601 there are disposed a collimating lens 602 and a diffraction grating 606 on an external grating mirror 605 inclined by $\theta$ with respect to the semiconductor laser optical axis. Here, when the incident angle on the diffraction grating 606 is 30°, the depth of the diffraction grating 606 is 0.29 $\mu$m and the pitch thereof, given by the above-mentioned equation (1), is 0.83 $\mu$m, the diffraction efficiency becomes about 10%, thereby obtaining a stable single mode oscillation. At this time, the longitudinal mode spectrum of the semiconductor laser 601 becomes as illustrated in FIG. 8. The laser light beam emitted from an end surface 608 of the semiconductor laser 601 is incident on the collimating lens 602 and then incident on the external grating mirror 605 having the diffraction grating 606. Thus, due to the external grating mirror 605, a portion of the incident light is feedbacked to an active layer 609 of the semiconductor laser 601, and the remainder thereof is incident as a reflected light (0 order diffraction light) on a focusing lens 604, having f=12.5 mm, without passing through a half-wave plate, so as to be condensed on one end surface 709 of a laser material (Nd: YVO$_4$) 708. The basic wave resonated between the end surface 709 of the laser material 708 and an output mirror 710 is wavelength-changed by a nonlinear optical material 711 and then outputted from the output mirror 710.

Figure 9:
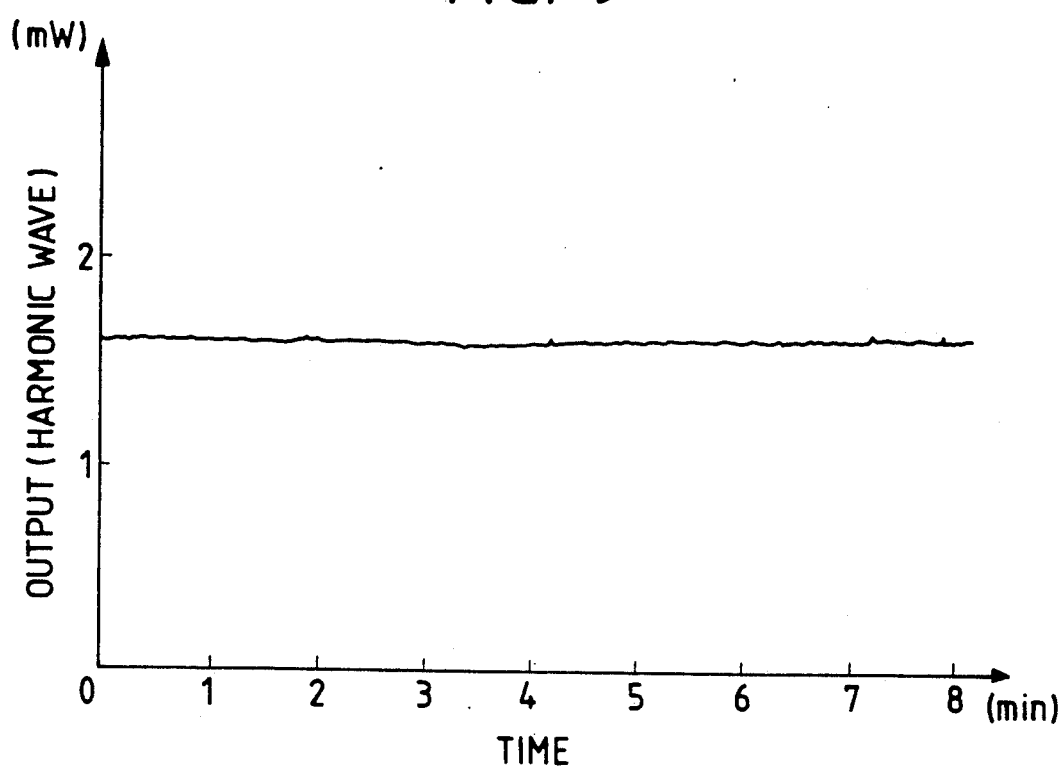
FIGS. 9 and 10 show the time characteristics of harmonic wave outputs emitted from am intra-cavity green light source.
Figure 10:
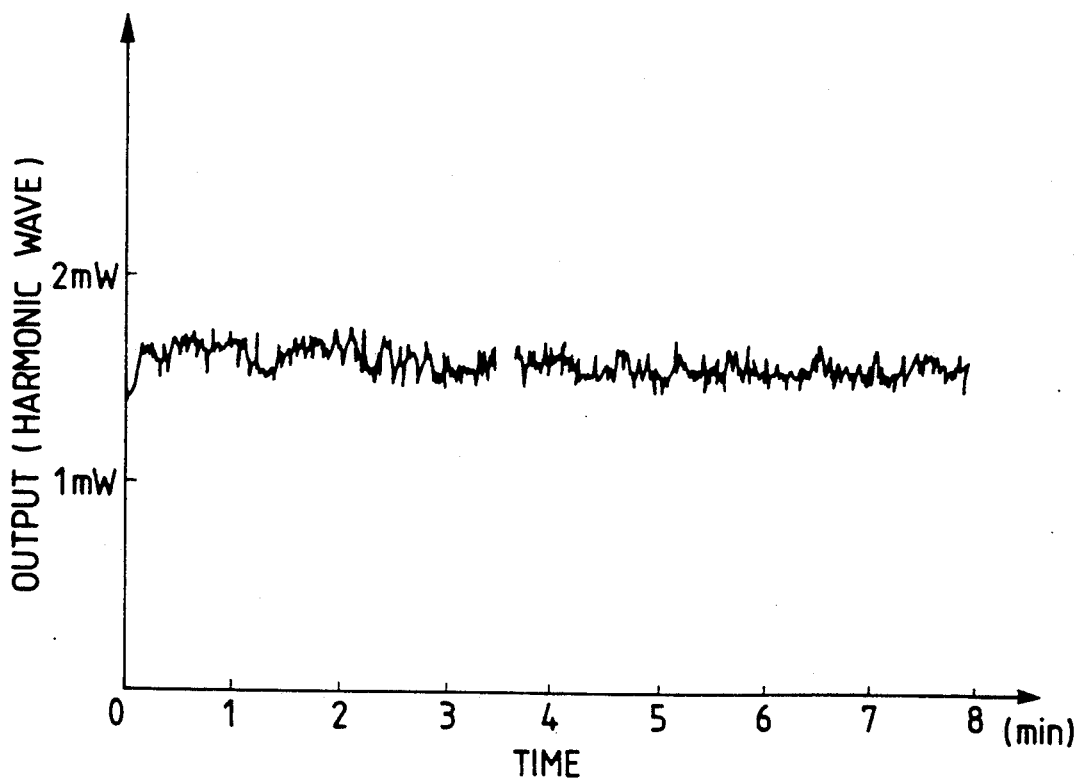

FIGS. 9 and 10 show the time characteristics of harmonic wave outputs emitted from am intra-cavity green light source. FIG. 9 shows an output characteristic when the longitudinal mode of the semiconductor laser is single as illustrated in FIG. 8, and FIG. 10 shows an output characteristic when the longitudinal mode of the semiconductor laser is multiple. As seen from these illustrations, for stabilization of the laser output, it is an essential condition that the longitudinal mode of the semiconductor laser takes the single state. The polarization-inverted wavelength-changing device in FIG. 7 also allows the wavelength of the semiconductor laser to be maintained to be single so that the fluctuation of the wavelength can be kept within the wavelength acceptance 0.2 nm of the device. Thus, the FIG. 7 short-wavelength light generating apparatus can output a stable harmonic wave.

Figure 11:
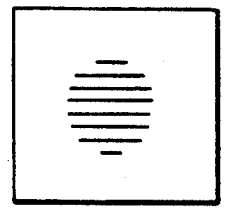
FIG. 11 shows a modification of the FIG. 7 short-wavelength light generating apparatus.
Figure 11:
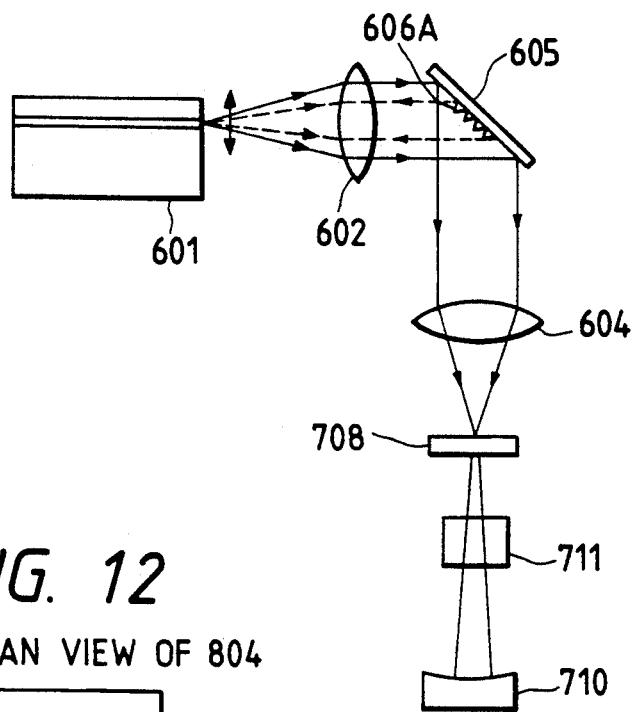

Here, since the external grating mirror in the FIGS. 6 and 7 apparatus is a linear diffraction grating whose diffraction efficiency is approximately 10%, the manufacturing thereof becomes easy. Further, although in the FIGS. 6 and 7 apparatus the diffraction grating is formed on the entire surface of the external grating mirror, it is appropriate that a diffraction grating 606A having a configuration such as an ellipse and square is formed on a portion of the external grating mirror 605 as illustrated in FIG. 11 so that the feedback efficiency becomes about 10%.

Figure 12:
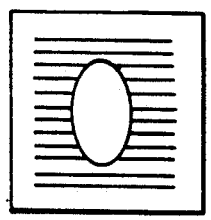
FIG. 12 shows an arrangement of a short-wavelength light generating apparatus according to a fifth embodiment of this invention.
Figure 12:
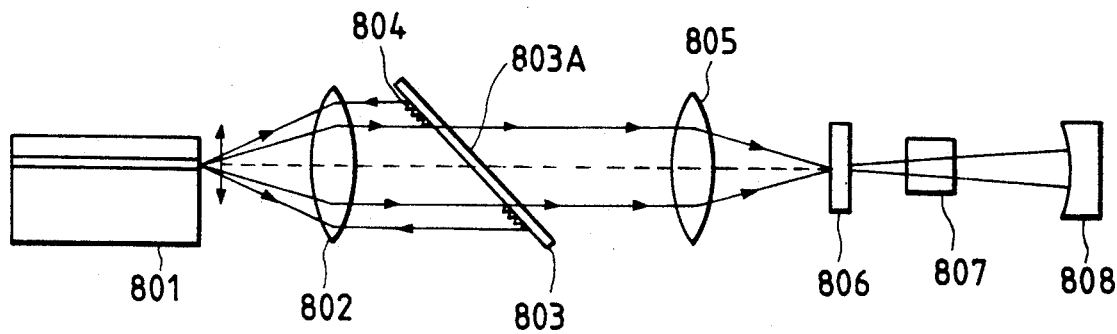

FIG. 12 shows an arrangement of a short-wavelength light generating apparatus according to a fifth embodiment of this invention. One feature of this embodiment is that an opening portion 803A having an ellipse or square configuration is formed in an external grating mirror 803 and a diffraction grating 804 is formed around the opening portion 803A on the external grating mirror 803. That is, a laser light beam emitted from a semiconductor laser (for example, corresponding to the semiconductor laser in FIG. 7) is incident on a collimating lens 802 so as to be converted into a parallel light beam which is in turn incident on the external grating mirror 803. A portion of the incident light beam on the external grating mirror 803 is reflected toward the semiconductor laser 801 and the other portion thereof passes through the opening portion 803A of the external grating mirror 803 to be directed through a focusing lens 805 to a section comprising a laser material 806, a nonlinear optical material 807 and an output mirror 808 (corresponding to the ports 708, 711 and 710 in FIG. 7, respectively). This arrangement has an advantage that the parts can linearly be arranged, concurrently with that it is possible to make stable the wavelength by the diffraction grating 804 provided around the opening portion 803A of the external grating mirror 803.

Figure 13:
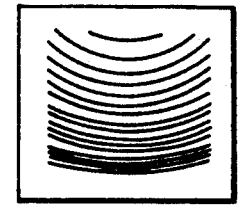
FIG. 13 shows an arrangement of a short-wavelength light generating apparatus according to a sixth embodiment of this invention.
Figure 13:
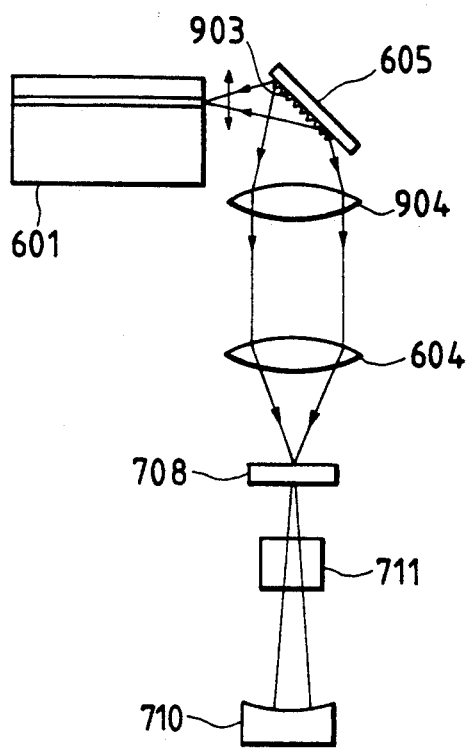

FIG. 13 shows an arrangement of a short-wavelength light generating apparatus according to a sixth embodiment of this invention where parts corresponding to those in FIG. 7 are marked with the same numerals and the description will be omitted for brevity. In FIG. 13, one feature of this embodiment is that a collimating lens is not provided between a semiconductor laser 601 and an external grating mirror 605 so that a light beam emitted from the semiconductor laser 601 is directly directed to the external grating mirror 605 inclined by an angle $\theta$ with respect to the optical axis of the semiconductor laser 601. Here, a diffraction grating 903 to be formed on the external grating mirror 605 has a configuration, given in accordance with the above-mentioned equation (3), as illustrated in FIG. 13. That is, the diffraction grating 903 is formed as being a portion of a group of circles successively arranged. The light beam reflected from the diffraction grating 903 is incident on a focusing lens 604 after passing through a collimating lens 903. The light beam condensed by the focusing lens 604 is incident on a laser material 708. Although in the method of directly feedbacking the light from the external grating mirror 605 to an active layer of the semiconductor laser 601 the diffraction efficiency of the external grating mirror generally becomes low whereby difficulty is encountered to improve the output efficiency. However, the above-described arrangement according to this embodiment can improve the output efficiency even if the diffraction efficiency is below 10%.

Figure 14:
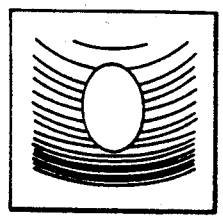
FIGS. 14 and 15 show modifications of the FIG. 13 short-wavelength light generating apparatus of the sixth embodiment of this invention.
Figure 14:
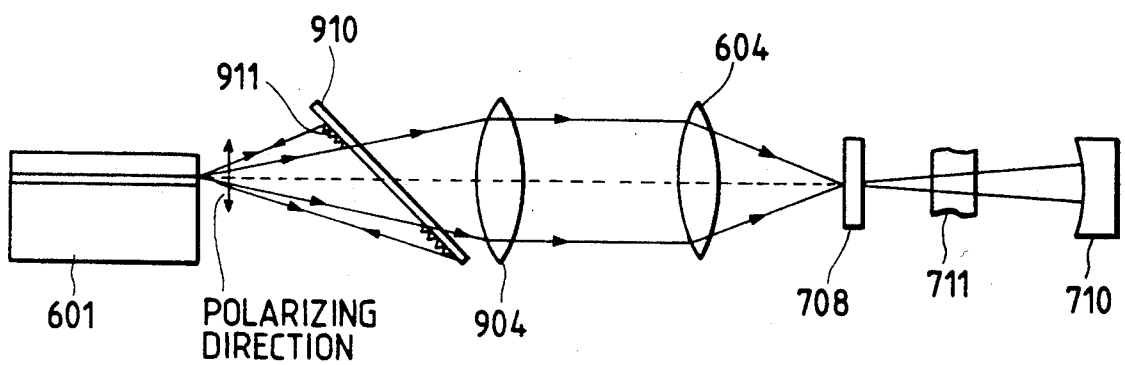
Figure 15:
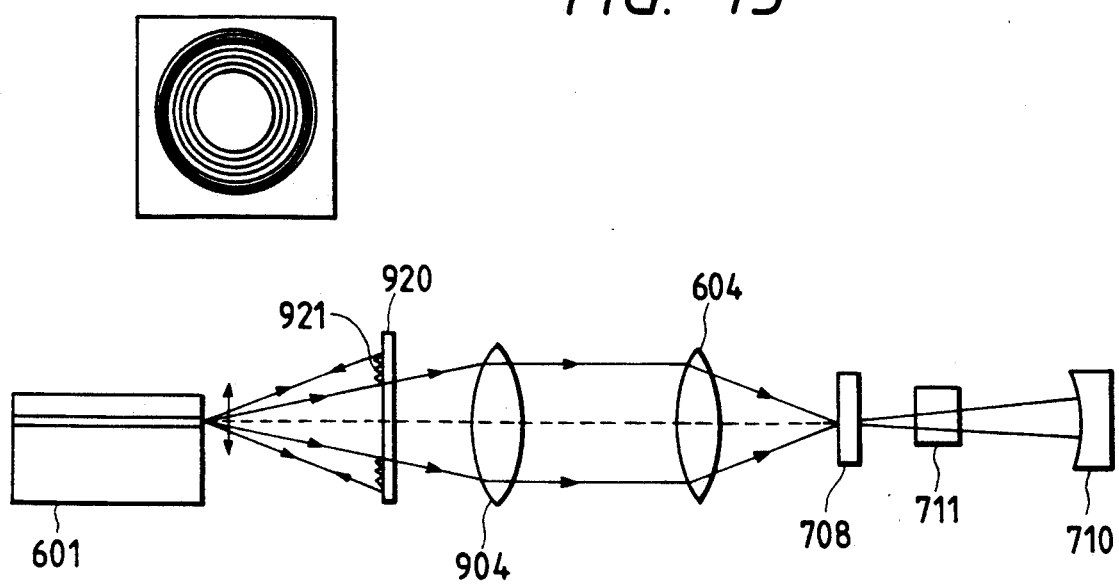

FIGS. 14 and 15 show modifications of the FIG. 13 short-wavelength light generating apparatus of the sixth embodiment of this invention. In FIG. 14, an opening portion having an elliptic configuration is formed in an external grating mirror 910 inclined by an angle $\theta$ with respect to the optical axis of the semiconductor laser 601. A diffraction grating 911 is formed as being a portion of a group of circles and formed around the opening portion of the external grating mirror 910. On the other hand, in FIG. 15, an opening portion having a circular configuration is formed in an external grating mirror 920 disposed in parallel to the outputting surface of the semiconductor laser 601, and a diffraction gating 921 is formed as being a group of circles so that the opening portion of the external grating mirror 920 is positioned at the center portion of the group of circles of the diffraction grating 921. These FIGS. 14 and 15 arrangements allow the components to be arranged linearly.

Figure 16:
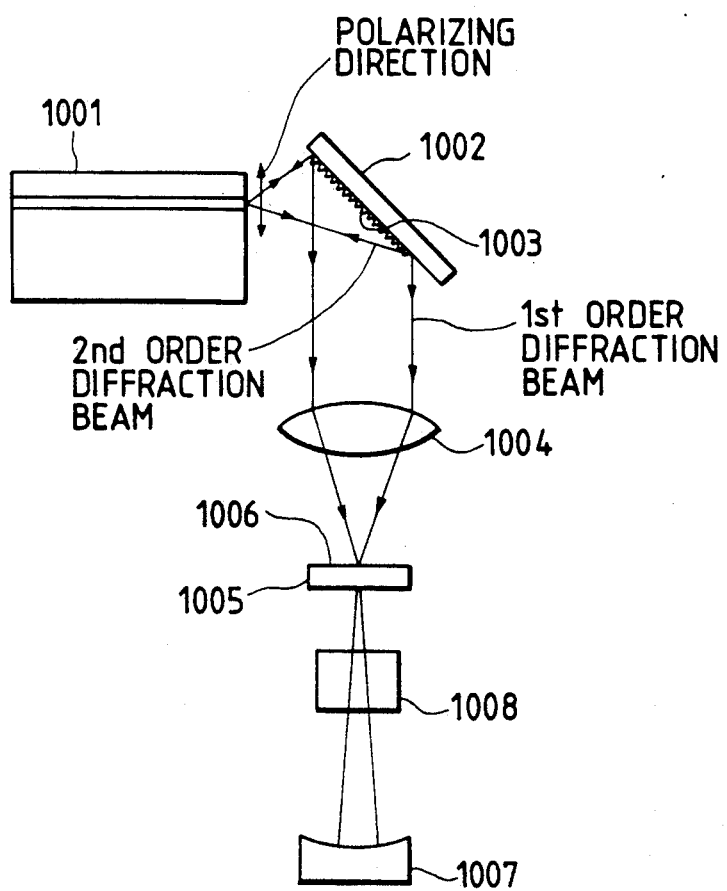
FIG. 16 shows an arrangement of a short-wavelength light generating apparatus according to a seventh embodiment of this invention.

FIG. 16 shows an arrangement of a short-wavelength light generating apparatus according to a seventh embodiment of this invention. In this embodiment, a collimating lens is not provided between a semiconductor laser and an external grating mirror but a diffraction grating is arranged to optically feedback and condense the 2nd order diffraction beam onto an active layer of a semiconductor laser and derives the 1st order diffraction beam as output light collimated. In FIG. 16, the apparatus comprises a semiconductor laser 1101 whose wavelength is 809 nm. The light beam emitted from the semiconductor 1001 is directly supplied to a diffraction grating 1003 provided on a surface of an external grating mirror 1002 inclined by an angle $\theta$ with respect to the optical axis of the semiconductor laser 1001. Here, the diffraction grating 1003 is designed such that its pitch d is two times as large as a pitch to be given with respect to the wavelength $\lambda$ and the incident angle $\theta$. For example, the diffraction grating 1003 is designed such that the pitch d = 1.15 μm, the depth = 0.56 μm and the incident angle $\theta$ = 33.4°. At this time, the 1st order diffraction efficiency becomes above 55% and the 2nd order diffraction efficiency becomes about 20%. The 1st order diffraction light beam collimated by the diffraction grating 1003 is incident on a focusing lens 1004 so as to be condensed on one end surface 1006 of a laser material (Nd: YVO₄) 1005, whereby the basic wave resonated between an output mirror 1007 and the end surface 1006 of the laser material 1005 is wavelength-changed by a nonlinear optical material (KTP) 1008 and then outputted from the output mirror 1007.

Figure 17:
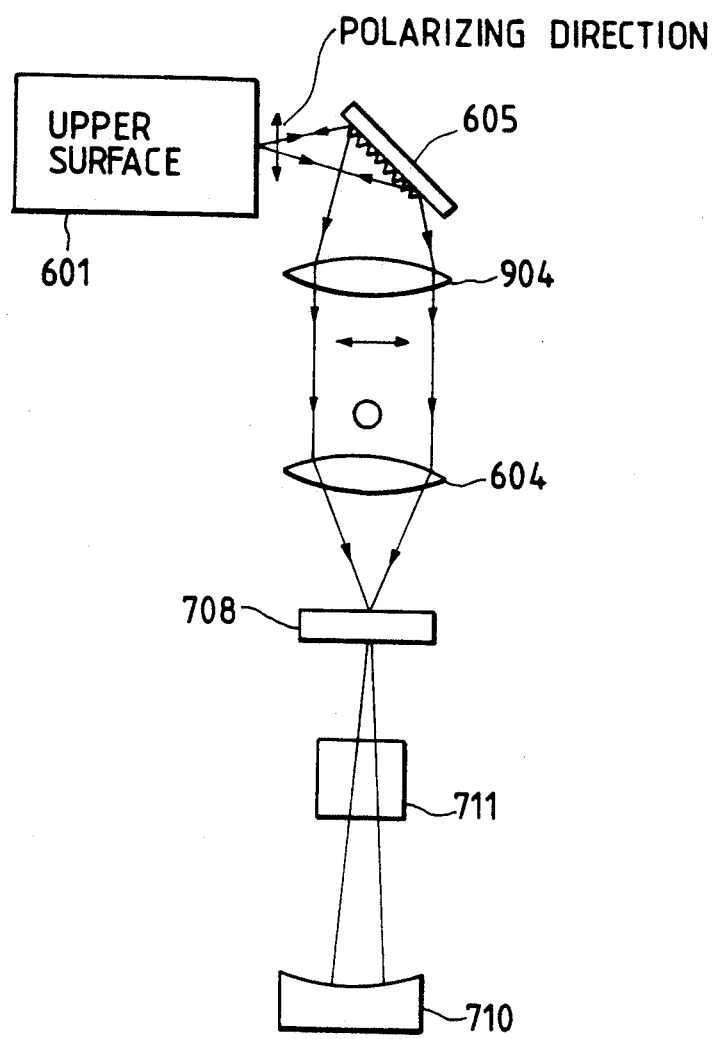
FIG. 17 shows a modification of the short-wavelength light generating apparatus according to each of the first to seventh embodiments of this invention.
Figure 18:
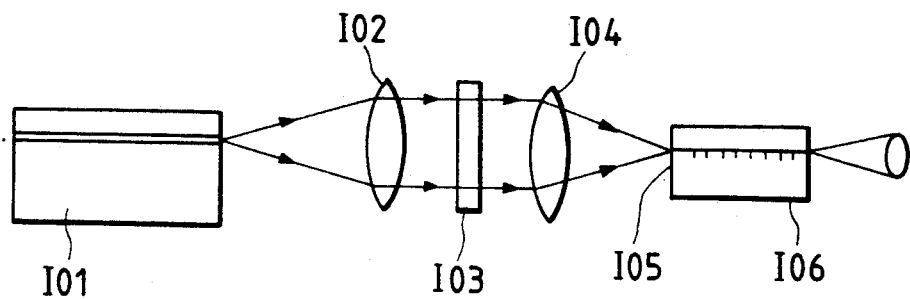
FIGS. 18 and 19 show arrangements of conventional short-wavelength light generating apparatus.
Figure 19:
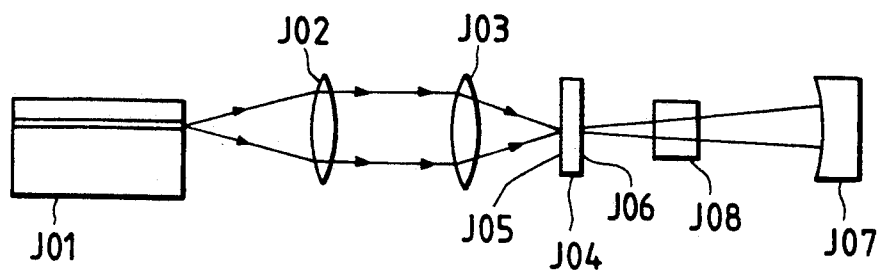

Although in the above-described embodiments the external grating mirror is disposed so that the polarizing direction of the semiconductor laser is substantially parallel to the direction of the channels of the diffraction grating, it is appropriate that the direction of the channels of the diffraction grating is arranged to be perpendicular to the polarizing direction of the semiconductor laser as illustrated in FIG. 17 where numerals are marked to be similar to those in FIG. 13.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example, although in the FIGS. 11 to 17 embodiments the short-wavelength light generating apparatus is based on a combination of the external-cavity semiconductor laser and the intra-cavity solid state laser, it is appropriate that the short-wavelength light generating apparatus is arranged on the basis of a combination the external-cavity semiconductor laser and the QPM polarization-inverted waveguide. This arrangement can also obtain a stable harmonic wave output with a high efficiency. Further, although in the above-described embodiments the wavelength is set to be 830 nm (suitable for the period of the polarization inversion) in the case of the polarization-inverted waveguide and the wavelength of the semiconductor laser is fixed to 809 nm, which is the central wavelength of the absorption spectrum of the laser material, in the case that Nd: YVO₄ is used as the laser material (solid state laser), it is possible to optionally select the wavelength of the laser with the angle $\theta$ of the external grating mirror with respect to the optical axis of the semiconductor laser being changed. That is, it is possible to use different solid state material such as YAG, LiSrF, LiCaF, YLF, NAB, KNP, LNP, NYAB, NPP and GGG in which the rare earths are doped. With these arrangements, it is possible to obtain near-infrared light and further it is possible to obtain different visible light (red light, blue light) by the wavelength change. Moreover, although in the above-described embodiments the KTP (KTiPO₄) is used as a wavelength changing material in the case of the intra-cavity type, it is also possible to use the organic nonlinear optical materials or inorganic nonlinear optical material such as KN(KNbO3), KAP(KAsPO₄), BBO and LBO. Further, it is possible to use a bulk type polarization-inverting element (for example, LiNbO3, LiTaO3). In addition, they are applicable to pumping light source semiconductor laser by using a fluoride fiber in which a rare earth such as Ho, Er, Tm, Sm and Nd is doped.

What is claimed is:

1. A short-wavelength light generating apparatus, comprising:

laser light generating means for generating a laser light beam having an oscillated wavelength;

external grating mirror means having a reflection type diffraction grating for reflecting a first part of the laser light beam emitted from the laser light generating means to feed back the first part of the laser light beam to the laser light generating means, the oscillated wavelength of the laser light beam being stabilized within a wavelength acceptance;

quasi-phase matching polarization-inverted waveguide means for changing the oscillated wavelength of a second part of the laser light beam which is stabilized by the external grating mirror means and is emitted from the laser light generating means, the quasi-phase matching polarization-inverted waveguide means being arranged to position the laser light generating means between the quasi-phase matching polarization-inverted waveguide means and the external grating mirror means; and optical coupling means for leading the second part of the laser light beam emitted from the laser light generating means to the quasi-phase matching polarization-inverted waveguide means.

2. A short-wavelength light generating apparatus, comprising:

laser light generating means for generating a laser light beam having an oscillated wavelength;

external grating mirror means having a reflection type diffraction grating for diffracting a first part of the laser light beam emitted from the laser light generating means to feed back the first part of the laser light beam to the laser light generating means and for reflecting a second part of the laser light beam emitted from the laser light generating means to generate 0 order diffraction light of the laser light beam, the oscillated wavelength of the laser light beam being stabilized within a wavelength acceptance by the first part of the laser light beam fed back to the laser light generating means; and quasi-phase matching polarization-inverted waveguide means for changing the oscillated wavelength of the 0 order diffraction light of the laser light beam reflected by the external grating mirror means.

3. A short-wavelength light generating apparatus, comprising:
  laser light generating means for generating a laser light beam having an oscillated wavelength;
  external grating mirror means having a reflection type diffraction grating for diffracting a first part of the laser light beam emitted from the laser light generating means to feed back second-order diffraction light of the laser light beam to the laser light generating means and for diffracting a second part of the laser light beam emitted from the laser light generating means to generate first-order diffraction light of the laser light beam, the oscillated wavelength of the laser light beam being stabilized within a wavelength acceptance by the second-order diffraction light of the laser light beam fed back to the laser light generating means; and
  quasi-phase matching polarization-inverted waveguide means for changing the oscillated wavelength of the first-order diffraction light diffracted by the external grating mirror means.

4. A short-wavelength light generating apparatus, comprising:
  laser light generating means for generating a laser light beam having an oscillated wavelength;
  external grating mirror means having a reflection type of diffraction grating for diffracting a first part of the laser light beam emitted from the laser light generating means to feed back diffraction light of the laser light beam to the laser light generating means and for transmitting a second part of the laser light beam emitted from the laser light generating means to generate transmitting light of the laser light beam, the oscillated wavelength of the laser light beam being stabilized within a wavelength acceptance by the diffraction light of the laser light beam fed back to the laser light generating means; and
  quasi-phase matching polarization-inverted waveguide means for changing the oscillated wavelength of the transmitting light generated by the external grating mirror means.

5. A short-wavelength light generating apparatus according to claim 4, wherein the external grating mirror means has an opening portion through which the transmitting light transmits to the quasi-phase matching polarization-inverted waveguide means, and the reflection type diffraction grating of the external grating mirror means is formed around the opening portion to diffract the first part of the laser light beam emitted from the laser light generating means.

6. A short-wavelength light generating apparatus, comprising:
  laser light generating means for generating a first laser light beam;
  external grating mirror means having a reflection type diffraction grating for reflecting a first part of the first laser light beam emitted from the laser light generating means to feed back the first part of the first laser light beam to the laser light generating means, a wavelength of the first laser light beam being stabilized to a first oscillated wavelength;
  resonating means having a laser oscillating material and an output mirror for resonating a second laser light beam having a second oscillated wavelength between the laser oscillating material and the output mirror, the first oscillated wavelength agreeing with a central wavelength of an absorption spectrum of the laser oscillating material to emit the second laser light beam from the laser oscillating material in cases where a second part of the first laser light beam which is stabilized by the external grating mirror means and is emitted from the laser light generating means is incident on the laser oscillating material; and the resonating means being arranged to position the laser light generating means between the resonating means and the external grating mirror means;
  a non linear optical material provided between the laser oscillating material and the output mirror of the resonating means for changing the second oscillated wavelength of the second laser light beam resonating in the resonating means to a third oscillated wavelength of a third light beam, the third light beam being output through the output mirror of the resonating means; and
  optical coupling means for leading the second part of the first laser light beam emitted from the laser light generating means to the laser oscillating material of the resonating means.

7. A short-wavelength light generating apparatus, comprising:
  laser light generating means for generating a first laser light beam;
  external grating mirror means having a reflection type diffraction grating for diffracting a first part of the first laser light beam emitted from the laser light generating means to feed back the first part of the first laser light beam to the laser light generating means and for reflecting a second part of the first laser light beam emitted from the laser light generating means to generate a 0 order diffraction light of the first laser light beam, a wavelength of the first laser light beam being stabilized to a first oscillated wavelength by the first laser light beam fed back to the laser light generating means;
  resonating means having a laser oscillating material and an output mirror for resonating a second laser light beam having a second oscillated wavelength between the laser oscillating material and the output mirror, the first oscillated wavelength agreeing with a central wavelength of an absorption spectrum of the laser oscillating material to emit the second laser light beam from the laser oscillating material in cases where the 0 order diffraction light generated in the external grating mirror means is incident on the laser oscillating material; and
  a non linear optical material provided between the laser oscillating material and the output mirror of the resonating means for changing the second oscillated wavelength of the second laser light beam resonating in the resonating means to a third oscillated wavelength of a third light beam, the third light beam being output through the output mirror of the resonating means.

8. A short-wavelength light generating apparatus, comprising:
  laser light generating means for generating a first laser light beam;
  external grating mirror means having a reflection type diffraction grating for diffracting a first part of the first laser light beam emitted from the laser light generating means to feed back second-order diffraction light of the first laser light beam to the laser light generating means and for diffracting a second part of the first laser light beam emitted from the laser light generating means to generate first-order diffraction light of the first laser light beam, a wavelength of the first laser light beam emitted from the laser light generating means being stabilized to a first oscillated wavelength by the second-order diffraction light fed back to the laser light generating means;

resonating means having a laser oscillating material and an output mirror for resonating a second laser light beam having a second oscillated wavelength between the laser oscillating material and the output mirror, the first oscillated wavelength agreeing with a central wavelength of an absorption spectrum of the laser oscillating material to emit the second laser light beam from the laser oscillating material in cases where the first-order diffraction light generated in the external grating mirror means is incident on the laser oscillating material; and a non linear optical material provided between the laser oscillating material and the output mirror of the resonating means for changing the second oscillated wavelength of the second laser light beam resonating in the resonating means to a third oscillated wavelength of a third light beam, the third light beam being output through the output mirror of the resonating means.

9. A short-wavelength light generating apparatus, comprising:

laser light generating means for generating a first laser light beam;

external grating mirror means having reflection type diffraction grating for diffracting a first part of the first laser light beam emitted from the laser light generating means to feed back diffraction light of the first laser light beam to the laser light generating means and for transmitting a second part of the first laser light beam emitted from the laser light generating means to generate transmitting light of the first laser light beam, a wavelength of the first laser light beam emitted from the laser light generating means being stabilized to a first oscillated wavelength by the diffraction light fed back to the laser light generating means;

resonating means having laser oscillating material and an output mirror for resonating a second laser light beam having a second oscillated wavelength between the laser oscillating material and the output mirror, the first oscillated wavelength agreeing with a central wavelength of an absorption spectrum of the laser oscillating material to emit the second laser light beam from the laser oscillating material in cases where the transmitting light generated in the external grating mirror means is incident on the laser oscillating material; and a non linear optical material provided between the laser oscillating material and the output mirror of the resonating means for changing the second oscillated wavelength of the second laser light beam resonating in the resonating means to a third oscillated wavelength of a third light beam, the third light beam being output through the output mirror of the resonating means.

10. A short-wavelength light generating apparatus according to claim 9, wherein the external grating mirror means has an opening portion through which the transmitting light transmits to the laser oscillating material of the resonating means, and the reflection type diffraction grating of the external grating mirror means is formed around the opening portion to diffract the first part of the first laser light beam emitted from the laser light generating means.

* * * * *